(12) United States Patent
Kim et al.

(10) Patent No.: US 7,486,108 B2
(45) Date of Patent: Feb. 3, 2009

(54) CHARGE RECYCLING POWER GATE

(75) Inventors: Suhwan Kim, Seoul (KR); Daniel R. Knebel, Mahopac, NY (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 11/518,078

(22) Filed: Sep. 8, 2006

(65) Prior Publication Data

US 2007/0007997 A1   Jan. 11, 2007

Related U.S. Application Data

(63) Continuation of application No. 10/880,111, filed on Jun. 29, 2004, now Pat. No. 7,138,825.

(51) Int. Cl.
*H03K 17/16* (2006.01)
(52) U.S. Cl. .......................... 326/34; 326/83; 327/544; 365/227
(58) Field of Classification Search .................. 326/31, 326/33, 34, 83; 327/544; 365/227
See application file for complete search history.

(56) References Cited

U.S. PATENT DOCUMENTS 6,310,487 B1 * 10/2001 Yokomizo .................... 324/769
2002/0075038 A1 * 6/2002 Mathew et al. ................ 326/95

* cited by examiner

*Primary Examiner*—Daniel D Chang
(74) *Attorney, Agent, or Firm*—F. Chau & Associates, LLC

(57) ABSTRACT

A charge recycling power gate and corresponding method are provided for using a charge sharing effect between a capacitive load of a functional unit and a parasitic capacitance of a charge recycling means to turn on a switching means between a virtual ground and a ground, the charge recycling power gate including a first transistor, a virtual ground in signal communication with a first terminal of the first transistor, a ground in signal communication with a second terminal of the first transistor, a capacitor having a first terminal in signal communication with a third terminal of the first transistor and a second terminal in signal communication with the ground, and a second transistor having a first terminal in signal communication with the virtual ground and a second terminal in signal communication with the third terminal of the first transistor.

13 Claims, 9 Drawing Sheets

CHARGE RECYCLING POWER GATE

CROSS-REFERENCE TO RELATED APPLICATION

This is a continuation application of U.S. application Ser. No. 10/880,111, filed on Jun. 29, 2004, now U.S. Pat No. 7,138,825 the disclosure of which is incorporated by reference herein in its entirety.

BACKGROUND

The present disclosure relates to Complementary Metal Oxide Semiconductor ("CMOS") integrated circuits and, more particularly, to CMOS implementations for charge recycling in memory and logic elements.

With the advance of technology, the reduction of the supply voltage ("VDD") has become vital to reduce dynamic power usage and to avoid reliability problems in Deep Sub-Micron ("DMS") regimes. However, reducing VDD alone causes serious degradation to the circuit's performance. One way to maintain performance is to scale down both VDD and the threshold voltage. However, reducing the threshold voltage increases the leakage current exponentially. This problem escalates in DSM technologies.

SUMMARY

These and other drawbacks and disadvantages of the prior art are addressed by a Charge Recycling Power Gate Structure in accordance with embodiments of the present disclosure.

A charge recycling power gate and corresponding method are provided for using a charge sharing effect between a capacitive load of a functional unit and a parasitic capacitance of a charge recycling means to turn on a switching means between a virtual ground and a ground, the charge recycling power gate including a first transistor, a virtual ground in signal communication with a first terminal of the first transistor, a ground in signal communication with a second terminal of the first transistor, a capacitor having a first terminal in signal communication with a third terminal of the first transistor and a second terminal in signal communication with the ground, and a second transistor having a first terminal in signal communication with the virtual ground and a second terminal in signal communication with the third terminal of the first transistor.

These and other aspects, features and advantages of the present disclosure will become apparent from the following description of exemplary embodiments, which is to be read in connection with the accompanying drawings.

BRIEF DESCRIPTION OF THE DRAWINGS

The present disclosure teaches a Charge Recycling Power Gate Structure in accordance with the following exemplary figures, in which.

DETAILED DESCRIPTION OF PREFERRED EMBODIMENTS

The present disclosure provides a Charge Recycling Power Gate Structure to overcome the drawbacks and disadvantages of Conventional Power Gate Structures.

Figure 1:
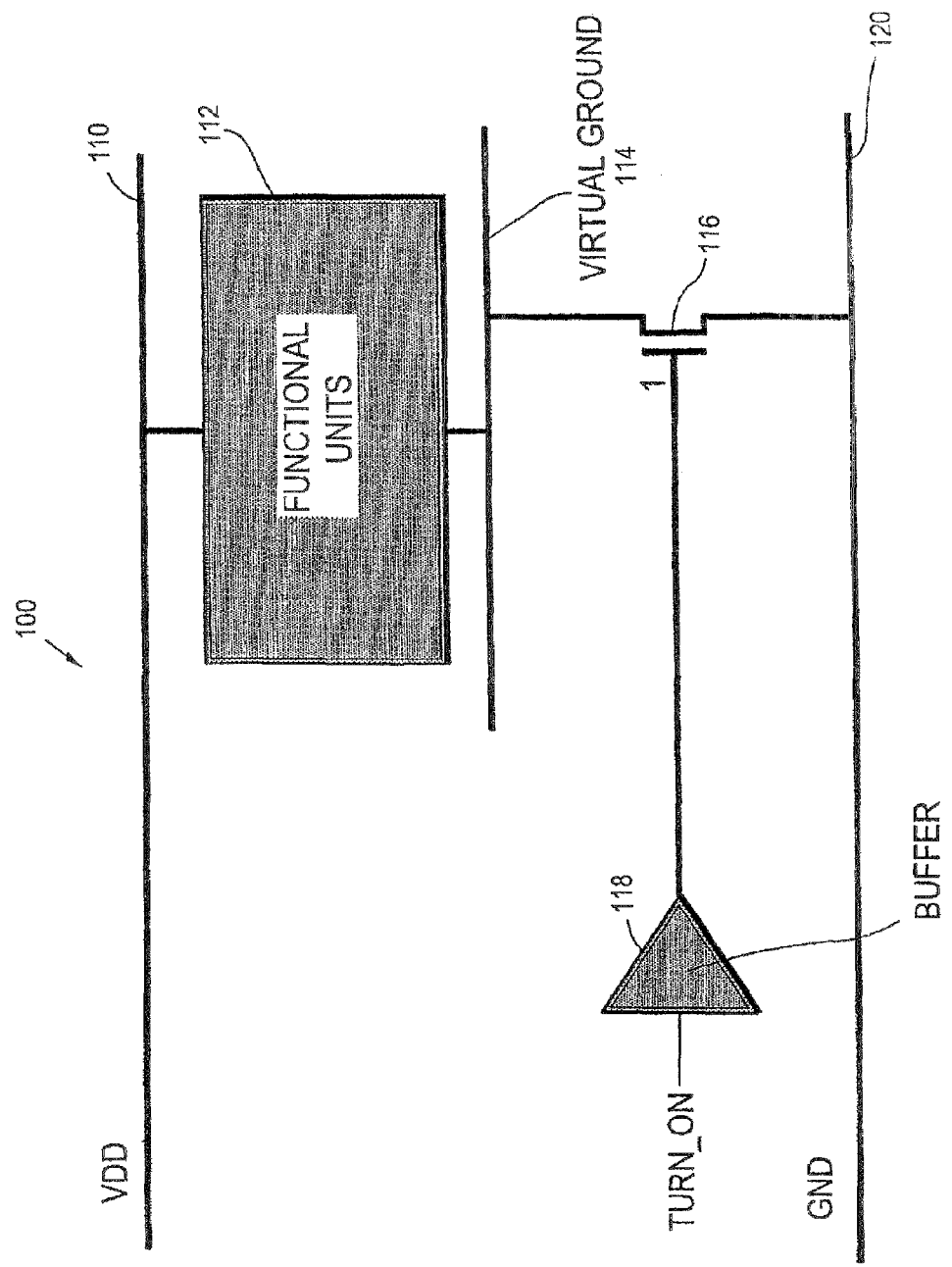
FIG. 1 is a schematic diagram showing a conventional power gate structure.

As shown in FIG. 1, a conventional power gate structure is indicated generally by the reference numeral 100. The structure 100 includes a power supply line 110 in signal communication with a functional units block 112. The block 112 is in signal communication with a virtual ground line 114, which is in signal communication with the drain terminal of a transistor 116. The gate terminal of the transistor 116 is in signal communication with the output terminal of a buffer 118, which, in turn, has an input for receiving a TURN_ON signal. The source terminal of the transistor 116 is in signal communication with a ground line 120.

A technique that has become increasingly popular in recent years is the use of multi-threshold CMOS ("MTCMOS") technology. MTCMOS circuits reduce leakage power during the standby mode, while attaining high speed in the active mode. MTCMOS logic gates are typically implemented using a combination of LVT and HVT devices and are connected to a virtual grounding line ("VGND"). This line is linked to the main ground rail ("GND") through a transistor, called a "sleep transistor". This sleep transistor is controlled by a TURN_ON signal used for active/standby mode control, where TURN_ON=0 or 1 during standby or active modes, respectively. The use of LVT transistors permit operating at low supply values with sufficient speed during the active mode. The power gating technique can also employ the use of a single VT transistor with reduced performance.

In the standby mode, the TURN_ON signal is deactivated to turn off the sleep device. This will cause the virtual ground line to float and so limit the leakage current to that of the sleep transistor. The leakage through the sleep transistor can be made small by using a HVT device or simply reducing the gate size of the sleep transistor. An overall leakage reduction is possible because of the effective decreased Drain to Source voltage across the serially connected sleep device and the off devices in the functional unit. The virtual ground rail is charged up to main supply rail ("VDD") when the sleep transistor is turned off for long time periods. The charge that is stored inside a functional unit is discharged to real ground when TURN_ON=1. As the switching activity of the TURN_ON node increases, the dynamic power consumption caused by power gate switching becomes larger than the leakage power reduction caused by the sleep transistor. It should be apparent that a complementary sleep transistor could be constructed using a PMOS device for the sleep transistor placed between a power supply rail (VDD) and the functional unit supply terminal.

Figure 2:
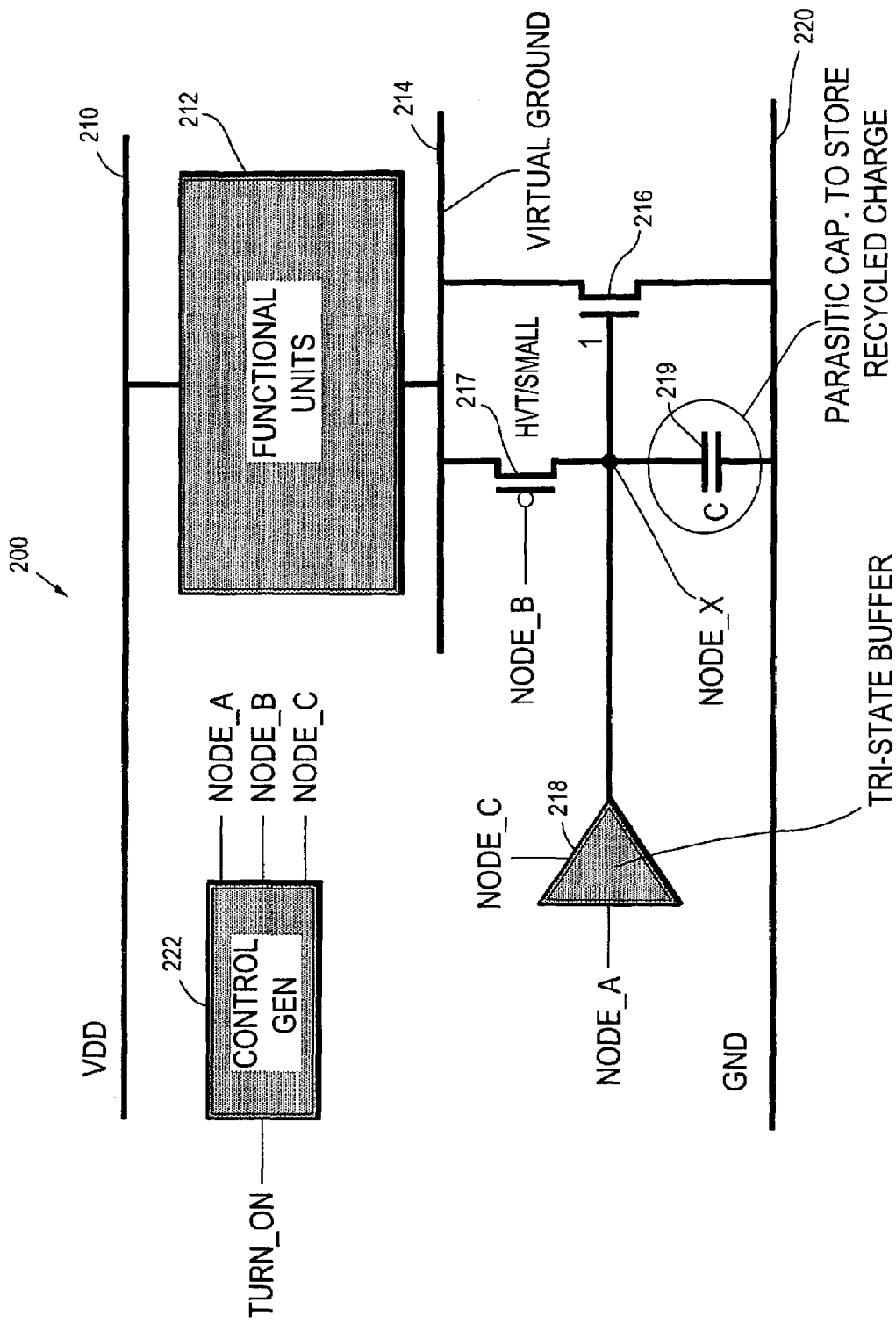
FIG. 2 is a schematic diagram showing a charge recycling power gate structure in accordance with an exemplary embodiment of the present disclosure.

Turning to FIG. 2, a charge recycling power gate structure is indicated generally by the reference numeral 200. The structure 200 includes a power supply line 210 in signal communication with a functional units block 212. The block 212 is in signal communication with a virtual ground line 214, which is in signal communication with the drain terminal of an NMOS transistor 216. The gate terminal or NODE_X of the transistor 216 is in signal communication with the output terminal of a tri-state buffer 218, which, in turn, has a first input for receiving a NODE_A signal and a second input for receiving a NODE_C signal. The source terminal of the transistor 216 is in signal communication with a ground line 220.

A control generation circuit 222 has an input for receiving a TURN_ON signal, and outputs for providing NODE_A, NODE_B and NODE_C signals, respectively. A PMOS transistor 217 for small HVT has its gate terminal in signal communication with the circuit 222 for receiving the NODE_B signal, its drain terminal in signal communication with the virtual line ground line 214, and its source terminal in signal communication with the output terminal of the tri-state buffer 218. A parasitic capacitor 219 is provided to store recycled charge, and has a first terminal in signal communication with the output terminal of the tri-state buffer 218 and a second terminal in signal communication with the ground line 220.

Thus, the charge recycling power gate structure 200 and other embodiments of the present disclosure provide for a charge recycling power gate ("CRPG") structure with a charge sharing path between a virtual ground and a gate node of an NMOS sleep transistor of the power gate structure. This charge sharing path is conditionally turned ON or OFF. It is mainly triggered by the power mode transition of the power gate structure. The charge sharing effect between the capacitive load of functional units and the parasitic capacitance of the power gate structure reduces the switching power consumption of the power gate structure.

As will be recognized by those of ordinary skill in the pertinent art, although the exemplary embodiment power gate structure is described with an NMOS sleep transistor, the concept of the charge recycling power gate structure can be applied to power gate structures with PMOS sleep transistors and to power gate structures with both PMOS and NMOS sleep transistors, inserted between the supply VDD and the functional unit.

Figure 3:
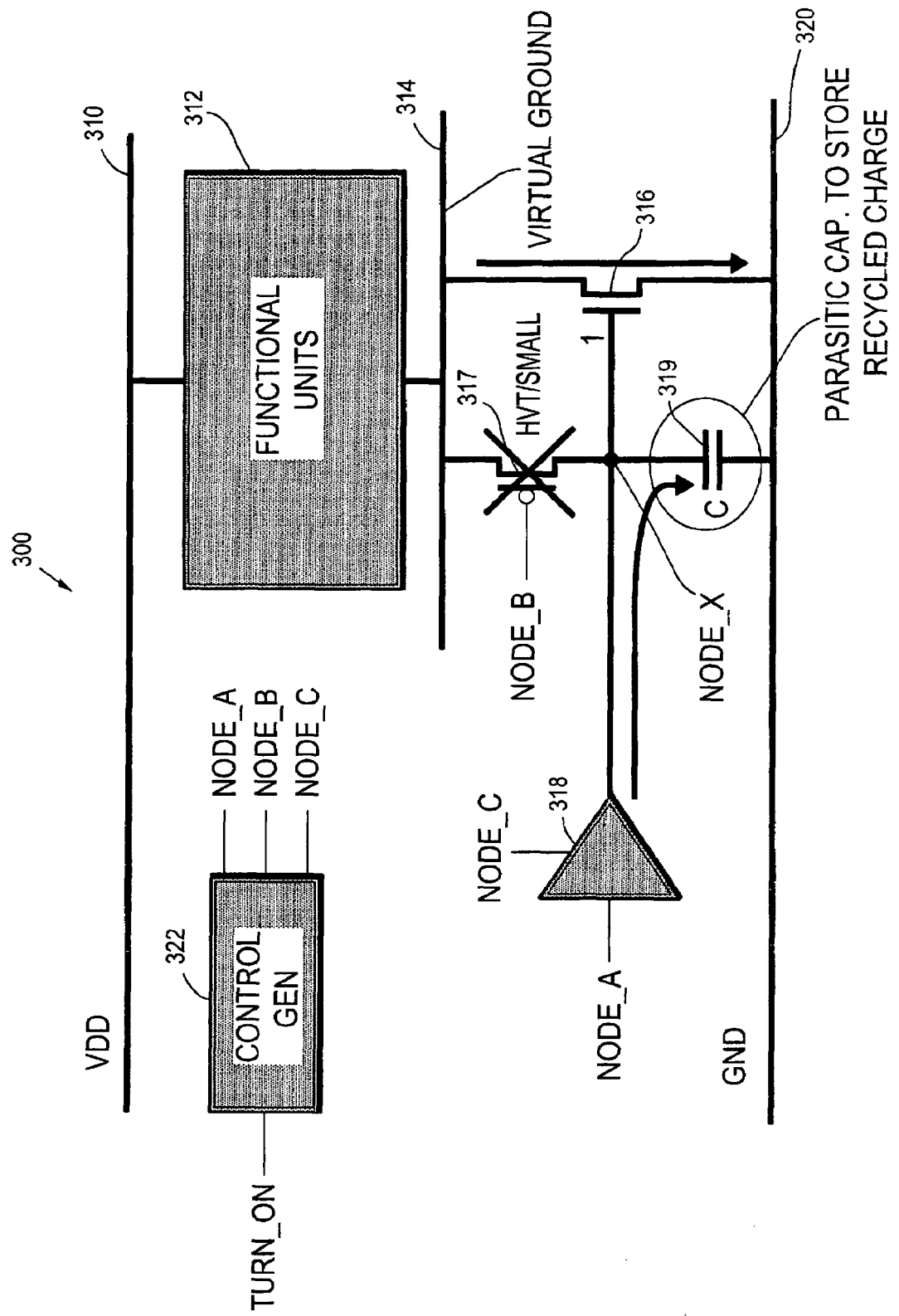
FIG. 3 is a schematic diagram showing the charge recycling power gate structure of FIG. 2 under particular conditions.

Turning now to FIG. 3, a charge recycling power gate structure is indicated generally by the reference numeral 300. The structure 300 is statically similar to the structure 200 of FIG. 2, so a detailed structural description is omitted.

The Charge Recycling Power Gate Structure 300 shows the current flow of a CRPG structure in a normal operation mode. In this mode, the NMOS transistor of the power gate structure operates in a linear mode. It can be modeled as a resistor that causes the performance degradation of functional units.

Figure 4:
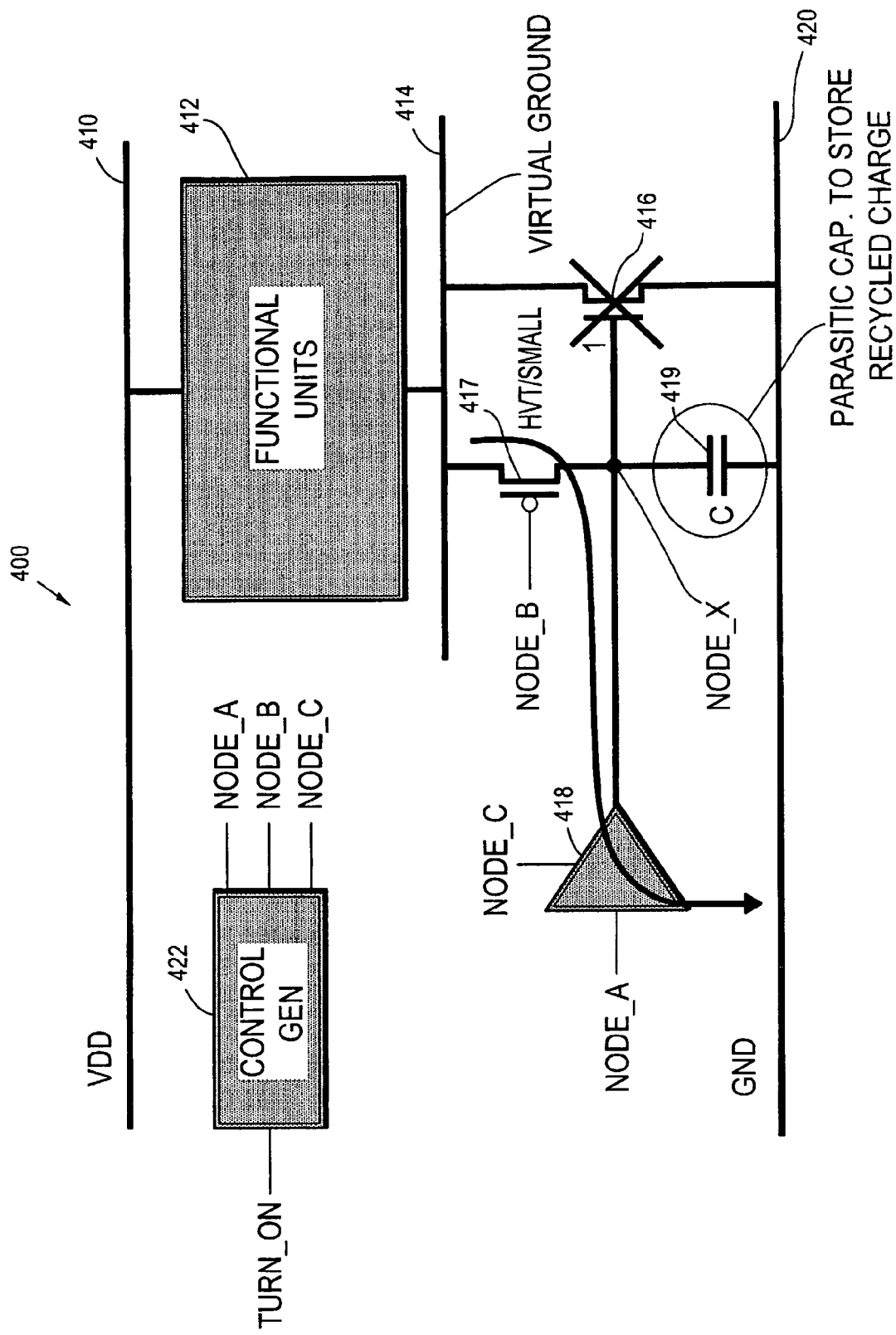
FIG. 4 is a schematic diagram showing the charge recycling power gate structure of FIG. 2 under particular conditions.

As shown in FIG. 4, a charge recycling power gate structure is indicated generally by the reference numeral 400. The structure 400 is statically similar to the structure 200 of FIG. 2, so a detailed structural description is omitted.

The structure 400 shows the current flow of a CRPG structure in data retention mode. In this mode, the PMOS transistor of the power gate structure is turned on and the tri-state buffer is activated. As the NODE_A becomes "LOW", the charge stored in the functional units is discharged through PMOS transistor of the power gate structure and NMOS transistors of the tri-state buffer.

A nonzero voltage of virtual ground will be caused by the PMOS transistor of the power gate structure connected in a source-follower mode. The virtual ground rail will clamp to a VTH of the PMOS device above the real GND. The NMOS devices in the circuits of the functional units are reverse biased and keep their logic values during this mode, while also having a reduced supply voltage.

Figure 5:
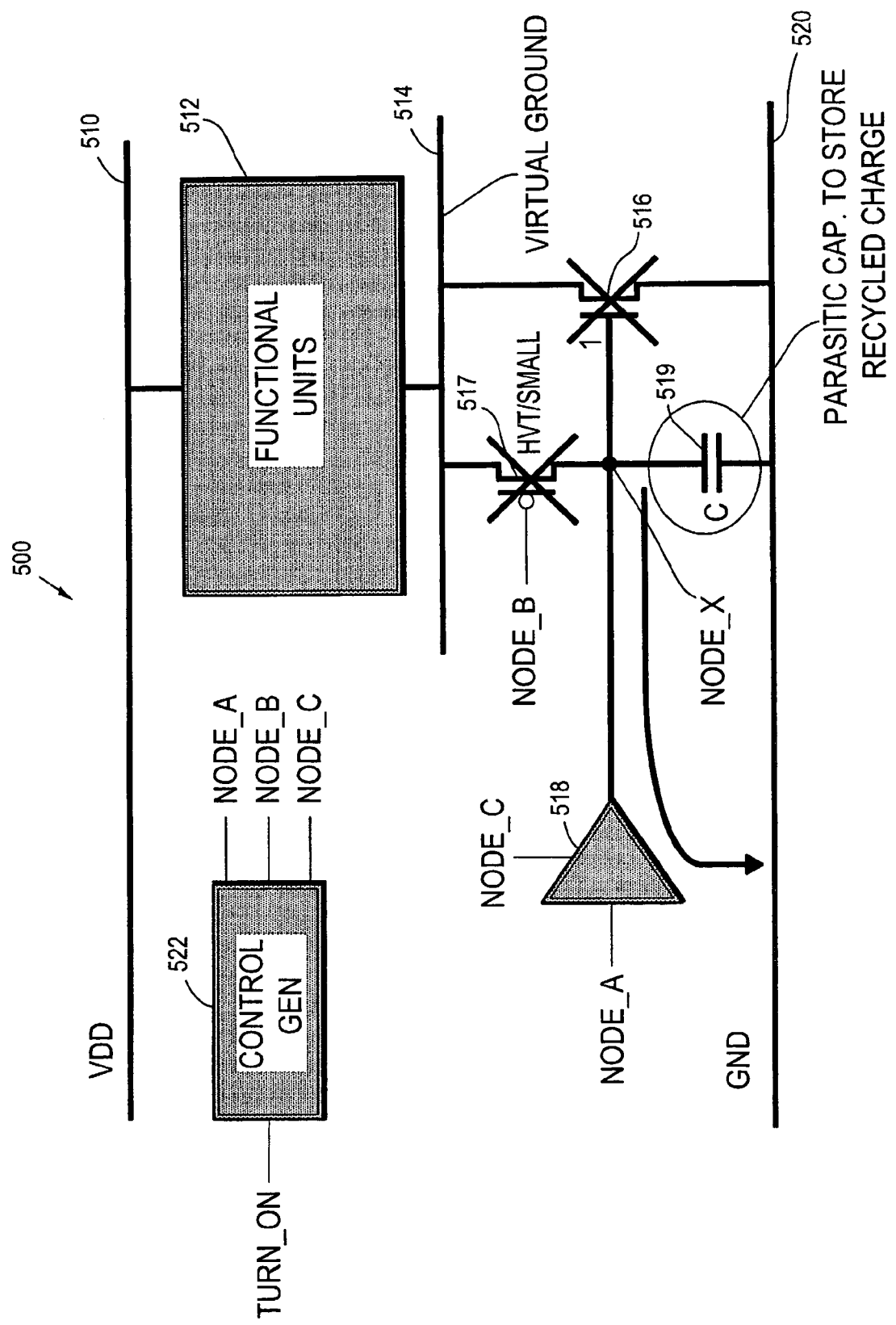
FIG. 5 is a schematic diagram showing the charge recycling power gate structure of FIG. 2 under particular conditions.

Turning to FIG. 5, a charge recycling power gate structure is indicated generally by the reference numeral 500. The structure 500 is statically similar to the structure 200 of FIG. 2, so a detailed structural description is omitted.

The structure 500 shows the current flow of a CRPG structure in a cut-off mode, which is the most effective mode to eliminate the leakage power consumption. The virtual ground is charged up to VDD as the cut-off period becomes longer.

Figure 6:
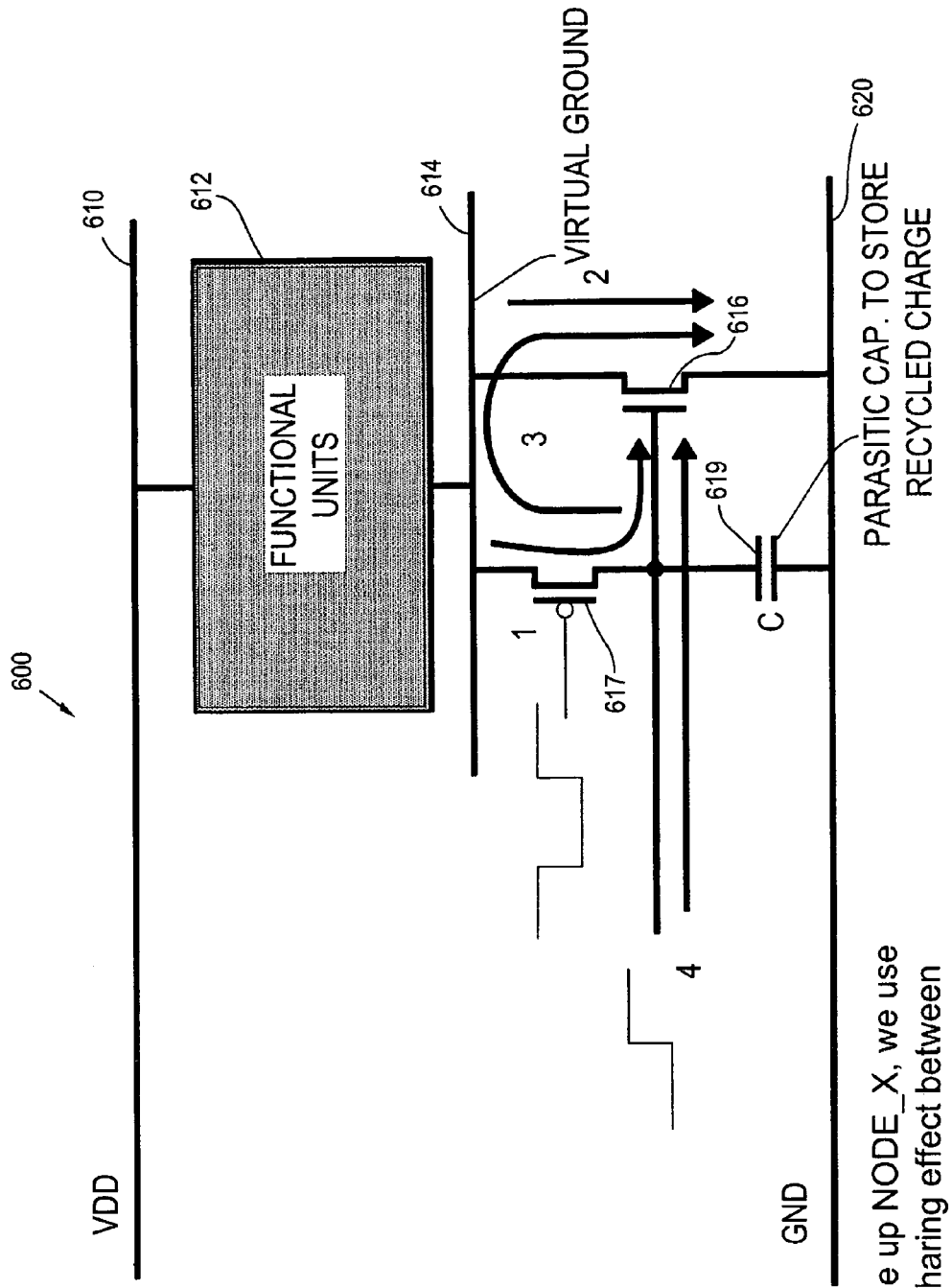
FIG. 6 is a schematic diagram showing the charge recycling power gate structure of FIG. 2 under particular conditions.

Turning now to FIG. 6, a charge recycling power gate structure is indicated generally by the reference numeral 600. The structure 600 is statically similar to the structure 200 of FIG. 2, so a detailed structural description is omitted.

The structure 600 shows the current flow of the CRPG structure's power mode transition between cut-off and normal operation mode. Unlike a conventional power gate structure, a CRPG structure uses the charge sharing effect between the capacitive load of functional units and the parasitic capacitance of the power gate structure to turn on an NMOS transistor. Usually, the capacitive load of functional units is larger than the parasitic capacitance of the power gate structure. Therefore, the voltage level of NODE_X quickly reaches higher than the threshold voltage of the NMOS transistor of the power gate structure. The NMOS transistor is turned on. The charge stored in functional units and the parasitic capacitor of the power gate structure is discharged.

However, the charge stored in the parasitic capacitance of the power gate structure is trapped and the voltage level of NODE_X remains at the same voltage level with the threshold voltage of the PMOS transistor of the power gate structure because of the PMOS transistor of the power gate structure. For normal operation, the voltage level of NODE_X is charged up to VDD when the tri-state buffer is activated and the NODE_A becomes "HIGH".

Figure 7:
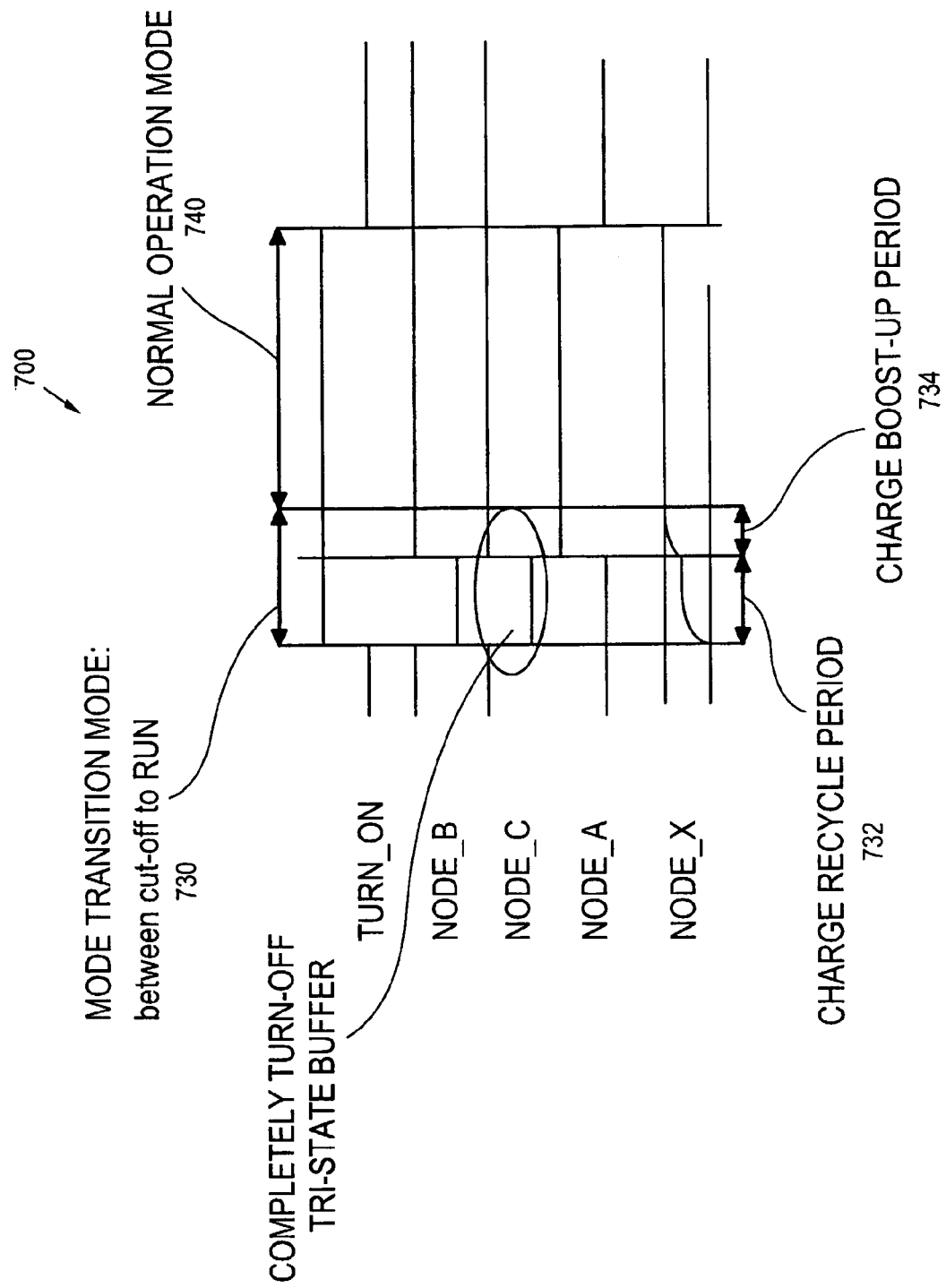
FIG. 7 is a timing diagram for the charge recycling power gate structure of FIG. 6.

As shown in FIG. 7, a timing diagram for the structure 600 of FIG. 6 is indicated generally by the reference numeral 700. The timing diagram 700 includes a Mode Transition portion 730 and a Normal Operation portion 740. The Mode Transition portion 730 includes a Charge Recycle Period 732 and a Charge Boost-Up Period 734.

Thus, the timing diagram 700 shows each node when the charge recycle power gate structure changes its power mode from cut-off to normal operation mode and from normal operation to cut-off mode.

Figure 8:
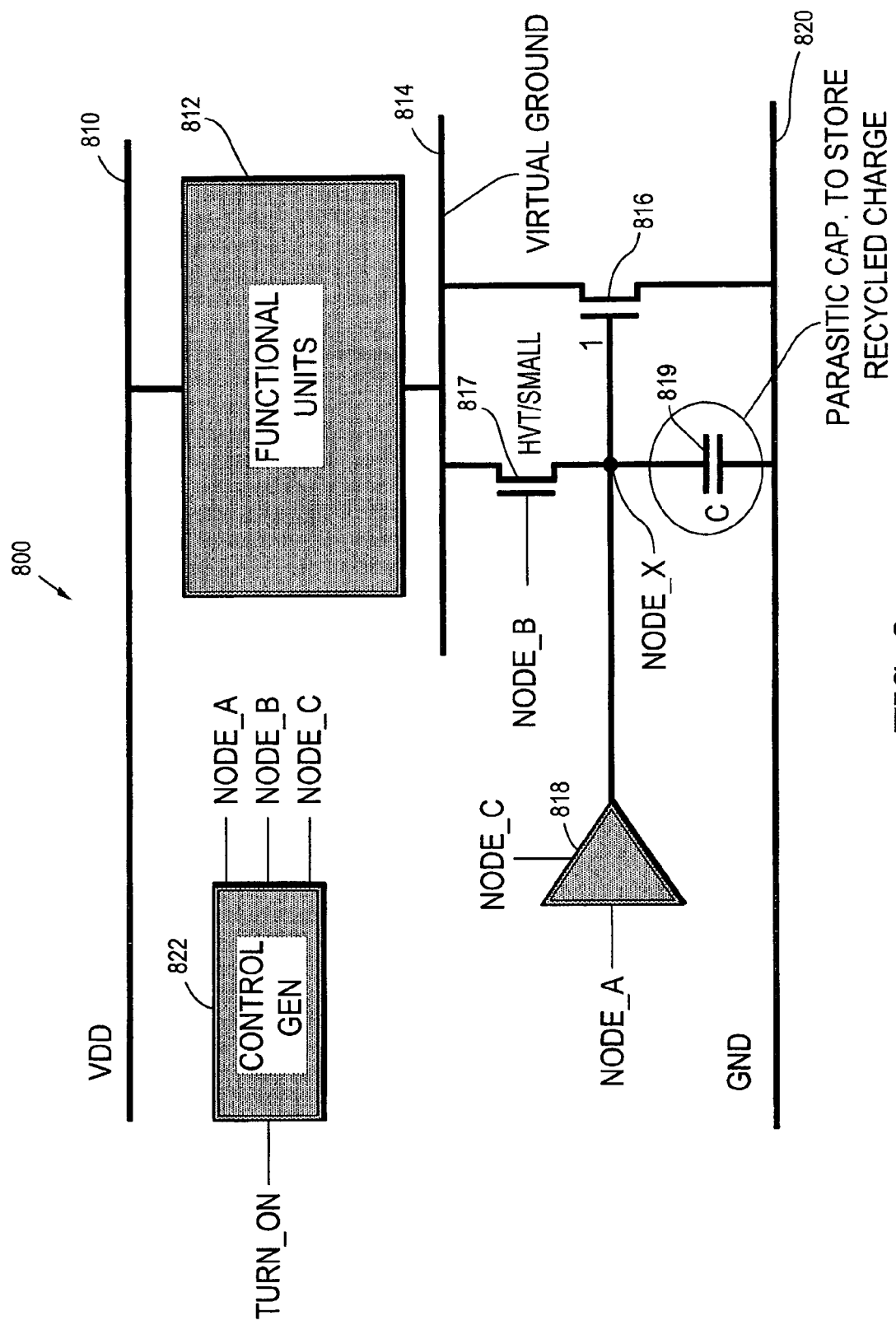
FIG. 8 is a schematic diagram showing a charge recycling power gate structure in accordance with an alternate exemplary embodiment of the present disclosure.

Turning to FIG. 8, a charge recycling power gate structure is indicated generally by the reference numeral 800. The structure 800 is somewhat similar to the structure 200 of FIG. 2, so a detailed structural description of the similar portions is omitted. The charge recycling power gate structure 800 does include an NMOS transistor 817 in place of the PMOS transistor of the structure 200.

Thus, as will be recognized by those of ordinary skill in the pertinent art, the configuration of the charge recycling power gate structure is not limited to the embodiments of FIGS. 2 through 6. For examples, the PMOS transistor of the recycling power gate structure can be replaced with an NMOS transistor as in the structure 800 or a transmission gate.

Figure 9:
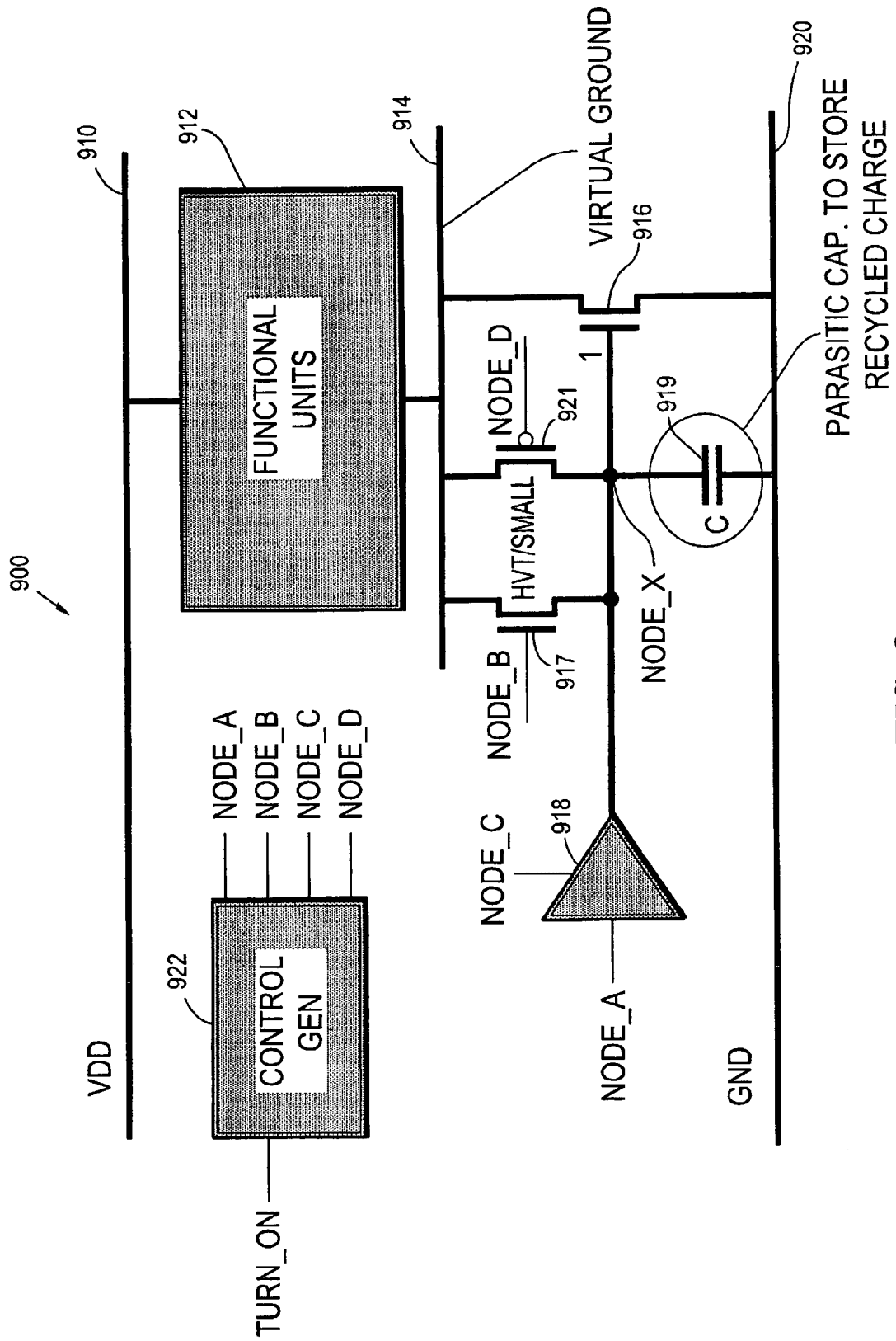
FIG. 9 is a schematic diagram showing a charge recycling power gate structure in accordance with another alternate exemplary embodiment of the present disclosure.

Turning now to FIG. 9, a charge recycling power gate structure is indicated generally by the reference numeral 900. The structure 900 is somewhat similar to the structure 800 of FIG. 8, so a detailed structural description of the similar portions is omitted. The charge recycling power gate structure 900 includes an additional PMOS transistor 921. A control generation circuit 922 has an input for receiving a TURN_ON signal, and outputs for providing NODE_A, NODE_B, NODE_C and NODE_D signals, respectively, where the NODE_D signal is in addition to those described for the embodiment 800 of FIG. 8. The PMOS transistor 921 has its gate terminal in signal communication with the circuit 922 for receiving the NODE_D signal, its drain terminal in signal communication with the virtual line ground line 914, and its source terminal in signal communication with the output terminal of the tri-state buffer 918 or NODE_X.

Thus, the charge sharing path of each configuration of the charge sharing power gate structure may be differently turned ON and OFF in alternate embodiments. The switching power reduction mechanism of the power gate structure is similar, as is the charge sharing between the capacitive load of the functional units and the parasitic capacitance of the power gate structure and the charge recycling of the shared charge. In addition, the functional units described in this disclosure are not limited to logic, and may comprise storage elements such as latches and embedded memories, for example.

Although illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. A charge recycling power gate comprising:
   a first transistor;
   a virtual ground connected to a first terminal of the first transistor;
   a ground connected to a second terminal of the first transistor;
   a capacitor having a first terminal connected to a third terminal of the first transistor and a second terminal connected to the ground; and
   a second transistor having a first terminal connected to the virtual ground and a second terminal connected to the third terminal of the first transistor.

2. A charge recycling power gate as defined in claim 1 wherein:
   the first transistor is an NMOS transistor;
   the first terminal of the first transistor is a drain terminal;
   the second terminal of the first transistor is a source terminal; and
   third terminal of the first transistor is a gate terminal.

3. A charge recycling power gate as defined in claim 1 wherein:
   the second transistor is a PMOS transistor;
   the first terminal of the second transistor is a drain terminal; and
   the second terminal of the second transistor is a source terminal.

4. A charge recycling power gate as defined in claim 1 wherein:
   the second transistor is an NMOS transistor;
   the first terminal of the second transistor is a drain terminal; and
   the second terminal of the second transistor is a source terminal.

5. A charge recycling power gate as defined in claim 1 wherein:
   the second transistor is a pair of CMOS transistors comprising an NMOS transistor and a PMOS transistor;
   the first terminal of the second transistor is a drain terminal of each of the NMOS and PMOS transistors; and
   the second terminal of the second transistor is a source terminal of each of the NMOS and PMOS transistors.

6. A charge recycling power gate as defined in claim 1, further comprising a buffer having an output connected to the third terminal of the first transistor.

7. A charge recycling power gate as defined in claim 1, further comprising a control generator connected to a third terminal of the second transistor.

8. A charge recycling power gate as defined in claim 7 wherein the control generator has an input for receiving a turn on signal.

9. A charge recycling power gate as defined in claim 1, further comprising:
   a buffer having an output terminal connected to the third terminal of the first transistor; and
   a control generator connected to at least one input terminal of the buffer.

10. A charge recycling power gate as defined in claim 9 wherein the control generator is connected to a third terminal of the second transistor.

11. A charge recycling power gate as defined in claim 1, further comprising:
    at least one functional unit connected to the virtual ground; and
    a power supply line connected to the at least one functional unit.

12. A charge recycling power gate as defined in claim 11 wherein the at least one functional unit is a logic unit.

13. A charge recycling power gate as defined in claim 11 wherein the at least one functional unit is a storage unit.

* * * * *